United States Patent
Su et al.

(10) Patent No.: US 10,083,902 B2
(45) Date of Patent: Sep. 25, 2018

(54) SEMICONDUCTOR PACKAGE STRUCTURE AND SEMICONDUCTOR PROCESS

(71) Applicant: Advanced Semiconductor Engineering, Inc., Kaohsiung (TW)

(72) Inventors: Yuan-Chang Su, Kaohsiung (TW); Chih-Cheng Lee, Kaohsiung (TW); Cheng-Lin Ho, Kaohsiung (TW)

(73) Assignee: ADVANCED SEMICONDUCTOR ENGINEERING, INC., Kaosiung (TW)

( * ) Notice: Subject to any disclaimer, the term of this patent is extended or adjusted under 35 U.S.C. 154(b) by 0 days.

(21) Appl. No.: 15/208,569

(22) Filed: Jul. 12, 2016

(65) Prior Publication Data

US 2016/0322292 A1 Nov. 3, 2016

Related U.S. Application Data

(63) Continuation of application No. 14/548,118, filed on Nov. 19, 2014, now Pat. No. 9,420,695.

(51) Int. Cl.
*H01L 23/498* (2006.01)
*H05K 1/18* (2006.01)
*H01L 21/48* (2006.01)

(52) U.S. Cl.
CPC ...... *H01L 23/49827* (2013.01); *H01L 21/486* (2013.01); *H01L 21/4857* (2013.01);
(Continued)

(58) Field of Classification Search
None
See application file for complete search history.

(56) References Cited

U.S. PATENT DOCUMENTS

| 5,250,843 A | 10/1993 | Eichelberger |
| 6,423,570 B1 | 7/2002 | Ma et al. |

(Continued)

FOREIGN PATENT DOCUMENTS

| CN | 1428800 A | 7/2003 |
| CN | 1518080 A | 8/2004 |

(Continued)

OTHER PUBLICATIONS

U.S. Office Action for U.S. Appl. No. 14/548,118, dated Nov. 2, 2015.

(Continued)

*Primary Examiner* — Long Pham
(74) *Attorney, Agent, or Firm* — Foley & Lardner LLP; Cliff Z. Liu

(57) ABSTRACT

Disclosed is a semiconductor package structure and manufacturing method. The semiconductor package structure includes a first dielectric layer, a second dielectric layer, a component, a patterned conductive layer and at least two conductive vias. The first dielectric layer has a first surface and a second surface opposite the first surface. The second dielectric layer has a first surface and a second surface opposite the first surface. The second surface of the first dielectric layer is attached to the first surface of the second dielectric layer. A component within the second dielectric layer has at least two electrical contacts adjacent to the second surface of the first dielectric layer. The patterned conductive layer within the first dielectric layer is adjacent to the first surface of the first dielectric layer. The conductive vias penetrate the first dielectric layer and electrically connect the electrical contacts with the patterned conductive layer.

21 Claims, 7 Drawing Sheets

(52) U.S. Cl.
CPC .. *H01L 23/49811* (2013.01); *H01L 23/49822* (2013.01); *H01L 23/49838* (2013.01); *H01L 23/49866* (2013.01); *H05K 1/188* (2013.01); *H01L 2924/0002* (2013.01)

(56) References Cited

U.S. PATENT DOCUMENTS

| | | | |
|---|---|---|---|
| 6,680,529 | B2 | 1/2004 | Chen et al. |
| 6,909,054 | B2 | 6/2005 | Sakamoto et al. |
| 6,914,322 | B2 | 7/2005 | Iijima et al. |
| 7,285,862 | B2 | 10/2007 | Sunohara et al. |
| 7,498,200 | B2 | 3/2009 | Sunohara et al. |
| 7,663,215 | B2 | 2/2010 | Tuominen et al. |
| 7,732,712 | B2 | 6/2010 | Yamano |
| 8,829,357 | B2 * | 9/2014 | Mikado ............. H05K 1/185 174/260 |
| 9,837,303 | B2 * | 12/2017 | Lin ............... H01L 21/76802 |
| 2003/0116843 | A1 | 6/2003 | Iijima et al. |
| 2003/0157747 | A1 | 8/2003 | Chen et al. |
| 2006/0272854 | A1 | 12/2006 | Yamano |
| 2009/0215231 | A1 | 8/2009 | Inoue |
| 2010/0062568 | A1 | 3/2010 | Tuominen et al. |
| 2014/0103488 | A1 | 4/2014 | Chen et al. |
| 2014/0138791 | A1 | 5/2014 | Chan et al. |
| 2014/0374150 | A1 | 12/2014 | Inagaki et al. |

FOREIGN PATENT DOCUMENTS

| | | |
|---|---|---|
| CN | 1882224 A | 12/2006 |
| CN | 101098588 A | 1/2008 |
| CN | 101546759 A | 9/2009 |
| CN | 103730434 A | 4/2014 |
| CN | 103839899 A | 6/2014 |
| CN | 104241241 A | 12/2014 |

OTHER PUBLICATIONS

English translation of Search Report for Chinese Patent Application 201510147262.5, dated Apr. 10, 2017, 2 pages.
Office Action and Search Report for Chinese Patent Application No. 201510147262.5, dated Apr. 10, 2017, 9 pages.
English translation of Search Report for Chinese Patent Application 201510147262.5, dated Jun. 16, 2017, 2 pages.
Office Action and Search Report for Chinese Patent Application No. 201510147262.5, dated Jun. 16, 2017, 5 pages.

* cited by examiner

SEMICONDUCTOR PACKAGE STRUCTURE AND SEMICONDUCTOR PROCESS

CROSS-REFERENCE TO RELATED APPLICATION

The present application is a continuation of U.S. patent application Ser. No. 14/548,118 filed Nov. 19, 2014, now U.S. Pat. No. 9,420,695 issued Aug. 16, 2016, the contents of which are incorporated herein by reference in their entirety.

BACKGROUND

1. Technical Field

The present disclosure relates to a semiconductor package structure and a semiconductor process, and more particularly to a semiconductor package structure and a semiconductor process thereof.

2. Description of the Related Art

Semiconductor devices have become progressively more complex, driven at least in part by the demand for smaller sizes and enhanced processing speeds. At the same time, there is a demand to further miniaturize many electronic products containing these semiconductor devices. Semiconductor devices are typically packaged, and then may be installed on a substrate that includes electrical circuitry, such as a circuit board. This results in space being occupied by both the semiconductor device package and the substrate, with a surface area on the substrate being occupied by the semiconductor device package. In addition, costs may be incurred by performing packaging, board manufacturing, and assembly as separate processes. It would be desirable to reduce the space occupied by the semiconductor device on the substrate, and to simplify and combine the packaging, board manufacturing, and assembly processes as applied to the semiconductor device and the substrate.

SUMMARY

In accordance with an embodiment of the present disclosure, a semiconductor package includes a first dielectric layer, a second dielectric layer, a component, a first patterned conductive layer and at least two first conductive vias. The first dielectric layer has a first surface and a second surface opposite the first surface. The second dielectric layer has a first surface and a second surface opposite the first surface. The second surface of the first dielectric layer is attached to the first surface of the second dielectric layer. A component within the second dielectric layer has at least two electrical contacts. The electrical contacts are adjacent to the second surface of the first dielectric layer. The first patterned conductive layer is within the first dielectric layer and is adjacent to the first surface of the first dielectric layer. The first conductive vias penetrate the first dielectric layer and electrically connect the electrical contacts with the first patterned conductive layer.

In accordance with an embodiment of the present disclosure, a semiconductor package includes a base layer, an insulating layer, a component, and a first patterned conductive layer. The component is within the base layer and has at least two electrical contacts exposed from the base layer. The insulating layer is disposed on the base layer and covers the exposed electrical contacts. The first patterned conductive layer is within the insulating layer and has a surface exposed from the insulating layer. The first conductive vias penetrate the insulating layer. The electrical contacts are electrically connected to the first patterned conductive layer through the first conductive vias.

In accordance with an embodiment of the present disclosure, a method of making a semiconductor package includes: (a) forming a patterned conductive layer on a carrier; (b) forming a first dielectric layer embedding the patterned conductive layer; (c) attaching a component with electrical contacts to the first dielectric layer; (d) forming a second dielectric layer on the first dielectric layer to encapsulate the component; (e) removing the carrier; and (f) forming a plurality of conductive vias penetrating the first dielectric layer, wherein the patterned conductive layer electrically connects with the electrical contacts of the component through the conductive vias.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Various substrates having semiconductor devices embedded or passive elements embedded have been proposed, wherein a semiconductor device or a passive element is first buried in a substrate and then a rerouting structure is fabricated in subsequent processes. The rerouting structure may include a redistribution layer (RDL) and interconnects (e.g., conducting posts) extending from the RDL and terminating as contact structures at the surface of a thick support layer, for the next level packaging structure. The RDL may be supported by the passivation layer formed over the embedded semiconductor device. A polymeric layer may be deposited over the RDL, and etched or drilled to provide a via for over-filling with a metal to form an interconnect (i.e., a conducting post) that extends above and beyond the opening of the via. A solder bump attached to the protruding end of the post is formed by electroless plating, screening or stencil printing.

Because the top surface of the passivation layer is not smooth, for example due to the pads of an embedded semiconductor device or passive element which extend beyond the surface of the semiconductor device, high-resolution lithography is not effective to form the vias and RDL. Consequently, the pitch of the RDL is limited. Moreover, failure to form the RDL may lead to the loss of a packaged substrate, including the loss of a relatively high cost semiconductor device or passive element buried in the package substrate.

Described herein is a semiconductor package and method of making the same in which high-resolution techniques may be used to reduce via hole width, reduce pad pitch, improve yield, and reduce manufacturing cost.

As used herein, each of the terms "upper", "lower", "top", "bottom" and "side" refer to the illustrated context in the corresponding figure associated with the description using the term. For example, a "side surface" indicates the side of the respective component in the orientation illustrated in the corresponding figure.

Figure 1:
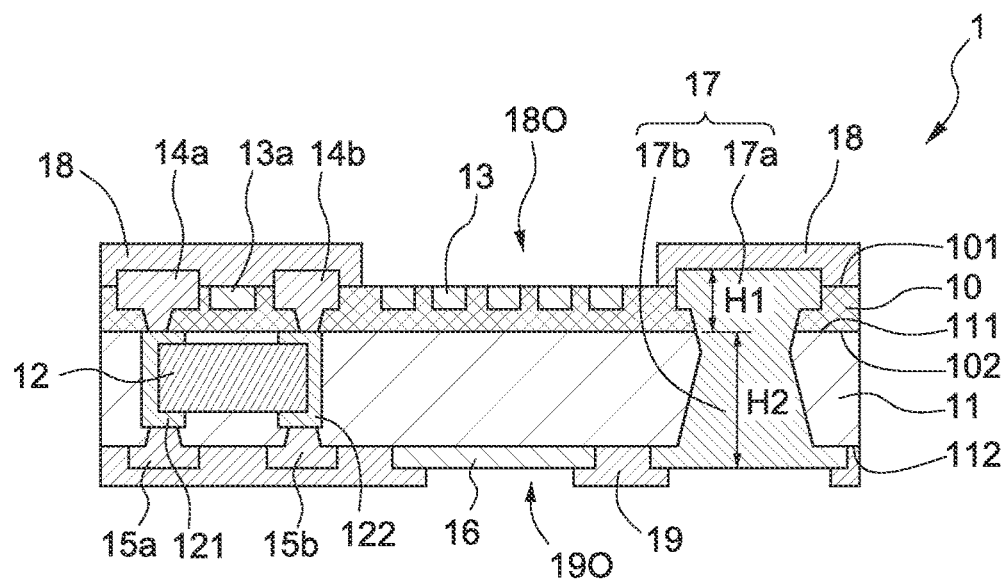
FIG. 1 illustrates a cross-sectional view of a semiconductor package structure in accordance with an embodiment of the present disclosure.

FIG. 1 illustrates a cross-sectional view of a semiconductor package structure 1 in accordance with an embodiment of the present disclosure. The semiconductor package structure 1 includes an insulating layer (e.g., a first dielectric layer 10), a base layer (e.g., a second dielectric layer 11), a passive element 12 (or other component), a first patterned conductive layer 13, conductive vias 14a, 14b, 15a, and 15b, a second patterned conductive layer 16, a through via 17, a first solder resister layer 18 and a second solder resist layer 19.

The first dielectric layer 10 includes a first surface 101 and a second surface 102 opposite to the first surface 101. The first dielectric layer 10 may include a hydrophobic material, such as, for example, a material forming a contact angle with water greater than 90 degrees, such as at least approximately 91 degrees, at least approximately 93 degrees, at least approximately 95 degrees, or at least approximately 97 degrees. The dielectric layer 10 may have a thickness from approximately 5 µm to approximately 30 µm.

The second dielectric layer 11 includes a first surface 111 and a second surface 112. The first surface 111 of the second dielectric layer 11 is attached to the second surface 102 of the first dielectric layer 10.

The second dielectric layer 11 may include, but is not limited to, molding compounds or pre-impregnated composite fibers (e.g., pre-preg). Examples of molding compounds may include, but are not limited to, an epoxy resin having fillers dispersed therein. Examples of a pre-preg may include, but are not limited to, a multi-layer structure formed by stacking or laminating a number of pre-impregnated materials/sheets.

The passive element 12 may be, for example, a capacitor, a resistor or an inductor. The passive element 12 has two electrical contacts 121 and 122. Each of the electrical contacts 121 and 122 extend from an upper surface of the passive element 12 along a side surface of the passive element 12 to a lower surface of the passive element 12. The passive element 12 is buried or encapsulated in the second dielectric layer 11 and is adjacent to the second surface 102 of the first dielectric layer 10.

The first patterned conductive layer 13 is embedded in the first dielectric layer 10. The first patterned conductive layer 13 may be, but is not limited to, a redistribution layer (RDL) including traces and contact pads. The first patterned conductive layer 13 is adjacent to the first surface 101 of the first dielectric layer 10. The first patterned conductive layer 13 includes a surface which is exposed from the first surface 101 of the first dielectric layer 10. Because the first patterned conductive layer 13 is embedded in the first dielectric layer 10, a minimum line width of approximately 2 µm or less and a minimum line-to-line space (pitch) of approximately 2 µm or less may be achieved. The first patterned conductive layer 13 may include, but is not limited to, copper (Cu) or another metal or alloy.

Conductive vias 14a, 14b penetrate the first dielectric layer 10 and electrically connect the electrical contacts 121, 122 of the passive element 12 with the first patterned conductive layer 13. The top surface of each of conductive vias 14a and 14b extends beyond the first surface 101 of the first dielectric layer 10. A portion of the first patterned conductive layer 13, for example a trace 13a, is located over the passive element and electrically isolated from the passive element. The trace 13a passes through a space between the two conductive vias 14a, 14b, and is electrically isolated from the two conductive vias 14a, 14b. Traces such as trace 13a may provide flexibility in circuit design of the first patterned conductive layer 13 of the semiconductor package structure 1. For example, relatively more of first patterned conductive layer 13 may be efficiently distributed per unit area of the first dielectric layer 10. In other words, a certain area of the first dielectric layer 10 may contain relatively more traces or contact pads, which may allow for reduction of the size of the semiconductor package structure 1.

A portion of each of conductive vias 15a and 15b is buried in the second dielectric layer 11, and the portion is electrically connected to the electrical contacts 121 and 122 of the passive element 12. A second patterned conductive layer 16 is disposed on the second surface 112 of the second dielectric layer. The second patterned conductive layer 16 may include, but is not limited to, copper (Cu) or another metal or alloy.

The through via 17 may include a first conductive via 17a and a second conductive via 17b. The first conductive via 17a is formed in the first dielectric layer 10 and the second dielectric layer 11. The first conductive via 17a has a top surface and a bottom surface. The first conductive via 17a tapers from the top surface to the bottom surface so that a width of the top surface is greater than a width of the bottom surface. The second conductive via 17b is formed in the second dielectric layer 11; the second conductive via 17b has a top surface and a bottom surface; the second conductive via 17b tapers from the bottom surface to the top surface so that a width of the top surface is less than a width of the bottom surface. In other words, the first conductive via 17a and the second conductive via 17b both include funnel-shaped portions facing in opposing directions, as illustrated in FIG. 1. The top surface of the second conductive via 17b is joined to the bottom surface of the first conductive via 17a within the second dielectric layer 11 to form the through via 17, a portion of which has substantially an hourglass shape (as illustrated in FIG. 1). In some embodiments, the first conductive via 17a may be formed integrally with the second conductive via 17b, and the first conductive via 17a may be joined to the second conductive via 17b at a tapered intersection or interface having a reduced width. A first portion of the through via 17 has a height H1 measured from the top surface of the first conductive via 17a to the second surface 102 of the first dielectric layer 10. A second portion of the through via 17 has a height H2 measured from the second surface 102 of the first dielectric layer 10 to the bottom surface of the second conductive via 17b. The height H2 may be greater than the height H1. In the embodiment of FIG. 1, the top surface of the first conductive via 17a extends beyond the first surface 101 of the first dielectric layer 10, and the bottom surface of the second conductive via 17b extends beyond the second surface 112 of the second dielectric layer 11.

The first solder resist layer 18 is disposed on the first surface 101 of the first dielectric layer 10. The first solder resist layer 18 covers a portion of the first patterned conductive layer 13 such as the trace 13a, the conductive vias 14a and 14b and the first conductive via 17a of the through via 17. The first solder resist layer 18 comprises a plurality of openings 180 to expose portions of the first patterned conductive layer 13 for contacting another device, such as a flip-chip-mounted semiconductor die.

The second solder resist layer 19 is disposed on the second surface 112 of the second dielectric layer 11. The second solder resist layer 19 covers a portion of the second patterned conductive layer 16, the conductive vias 15a and 15b and a portion of the bottom surface of the second conductive via 17b of the through via 17. The second solder resist layer 19 comprises a plurality of openings 190 to expose portions of the second patterned layer 16 for contacting another device, such as a printed circuit board.

FIG. 2A, FIG. 2B, FIG. 2C, FIG. 2D, FIG. 2E, FIG. 2F, FIG. 2G, FIG. 2H and FIG. 2I illustrate a manufacturing method in accordance with an embodiment of the present disclosure.

Figure 2A:
FIG. 2A, FIG. 2B, FIG. 2C, FIG. 2D, FIG. 2E, FIG. 2F, FIG. 2G, FIG. 2H and FIG. 2I illustrate a manufacturing method in accordance with an embodiment of the present disclosure.

Referring to FIG. 2A, a carrier 8 and a metal layer 9 are provided. The carrier 8 may be, for example, a silicon substrate, a plastic substrate, or a metal panel. The carrier 8 may facilitate the subsequent process thereon.

The metal layer 9 may be a thin sheet. In one embodiment, the metal layer 9 has a thickness of approximately 2 μm. The metal layer 9 may be, for example, a copper sheet or copper foil, or other conductive material.

Figure 2B:
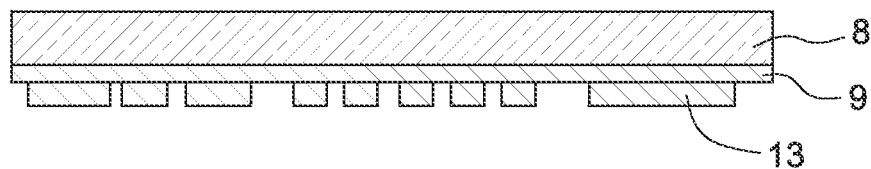

Referring to FIG. 2B, a first patterned conductive layer 13 is formed on the metal layer 9. The first patterned conductive layer 13 may be formed, for example, using photo-lithography and plating technology. In some embodiments, the first patterned conductive layer 13 is a relatively flat and smooth redistribution layer (RDL). The first patterned conductive layer 13 may include, but is not limited to, copper or another metal or alloy.

Figure 2C:
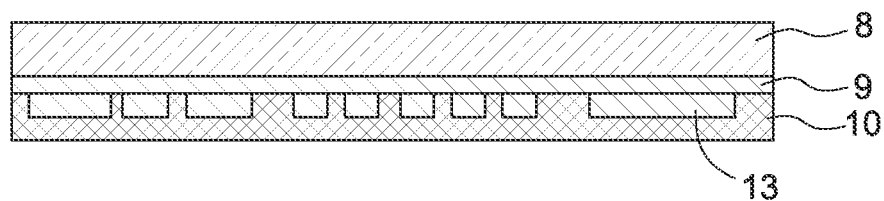

Referring to FIG. 2C, a first dielectric layer 10 is formed on the first patterned conductive layer 13 to bury or cover the first patterned conductive layer 13. The first dielectric layer 10 may be formed by laminating a dielectric adhesive material to the first patterned conductive layer 13, for example.

Figure 2D:
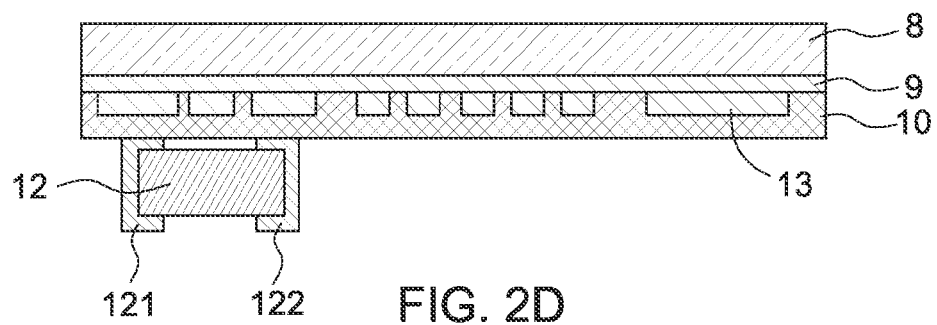

Referring to FIG. 2D, a passive element 12 with two electrical contacts 121 and 122 is bonded to the first dielectric layer 10. The passive element 12 may be, but is not limited to, a capacitor, an inductor or a resistor. The passive element 12 may be placed or pressed onto the first dielectric layer 10 by, for example, a die bonding equipment. The passive element 12 may be attached to the first dielectric layer 10 such that a portion of the electrical contacts 121 and 122 are buried in the first dielectric layer 10. The first dielectric layer 10 may affix the passive element 12 and provide sufficient electrical insulation between the electrical contacts 121 and 122 of the passive element 12 and the first patterned conductive layer 13. In one embodiment, the first dielectric layer 10 may have a thickness from approximately 5 μm to approximately 30 μm to provide sufficient electrical insulation; however, the thickness of the first dielectric layer 10 may be within another range in other embodiments.

The first dielectric layer 10 may be heated or cured after the bonding process of the passive element 12. The heated dielectric layer becomes solidified or hardened and therefore may provide the bond between the passive element 122 and the first dielectric layer 10.

Figure 2E:
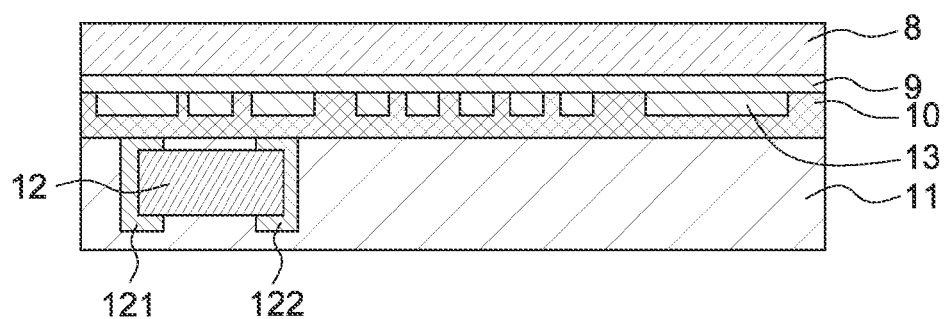

Referring to FIG. 2E, a second dielectric layer 11 is formed on the first dielectric layer 10 to encapsulate the passive element 12. For example, the second dielectric layer 11 may be formed using a molding technology which uses a molding compound with the help of a mold chase (not shown), to encapsulate the passive element 12. For another example, the second dielectric layer 11 may be formed by stacking or laminating a number of sheets (e.g., sheets made from pre-impregnated composite fibers) on the first dielectric layer 10 and the passive element 12 to form the second dielectric layer 11.

Figure 2F:
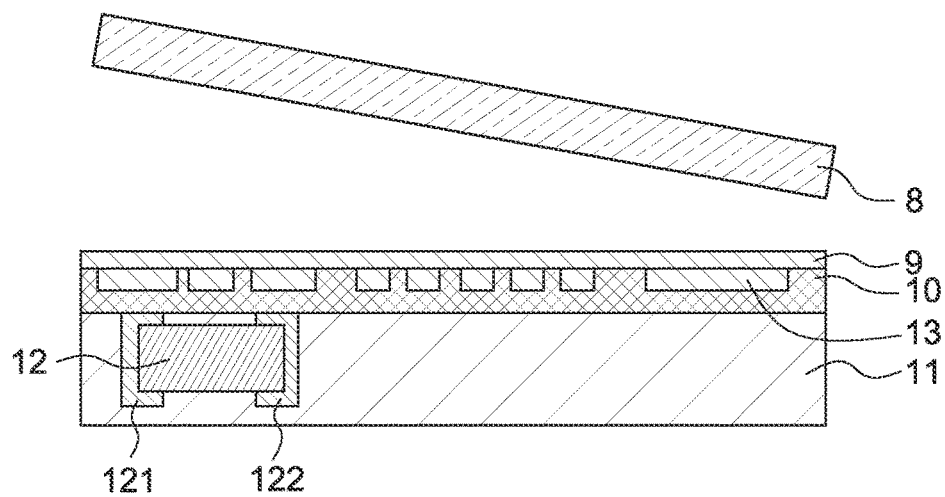

Referring to FIG. 2F, the metal layer 9, the first patterned conductive layer 13, the first dielectric layer 10, the passive element 12 and the second dielectric layer 11 are separated from the carrier 8. In other words, the carrier 8 is removed from the metal layer 9 and the structure formed thereon.

Figure 2G:
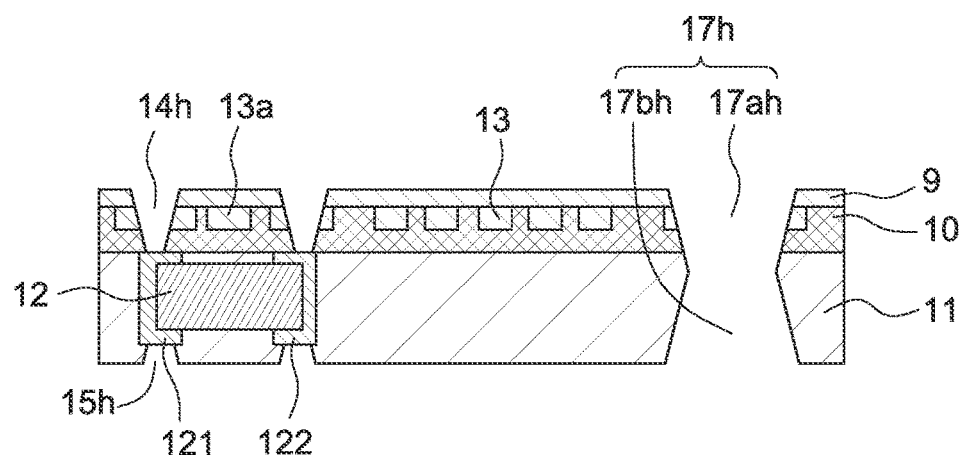

Referring to FIG. 2G a number of via holes 14h and 15h are respectively formed in the first dielectric layer 10 and the second dielectric layer 11 to expose a portion of the electrical contacts 121 and 122 of the passive element 12. A portion of the first patterned conductive layer 13, namely traces such as the trace 13a, is located between two via holes 14h.

A through via hole 17h is formed by forming a via hole 17ah and a via hole 17bh. The via hole 17ah is formed in the first dielectric layer 10 and in a portion of the second dielectric layer 11. The via hole 17ah tapers in a direction from the first dielectric layer 10 towards the second dielectric layer 11, so that the opening of the via hole 17ah at the intersection of the first dielectric layer 10 and the metal layer 9 is wider than the bottom of the via hole 17ah in the second dielectric layer 11. A via hole 17bh is formed in the second dielectric layer 11. The via hole 17bh tapers such that the opening of the via hole 17bh at the bottom surface of the second dielectric layer 11 is wider than the top of the via hole 17bh. The via hole 17ah and the via hole 17bh are joined in the second dielectric layer 11 to form a through via hole 17h, so as to penetrate the first dielectric layer 10 and the second dielectric layer 11. The via holes 14h, 15h and 17h may be formed, for example, by laser drilling or etching technology.

In some embodiments, a height of the via hole 17ah is greater than a height of the via holes 14h. In other embodiments, a height of the via hole 17ah is substantially the same as a height of the via holes 14h.

Figure 2H:
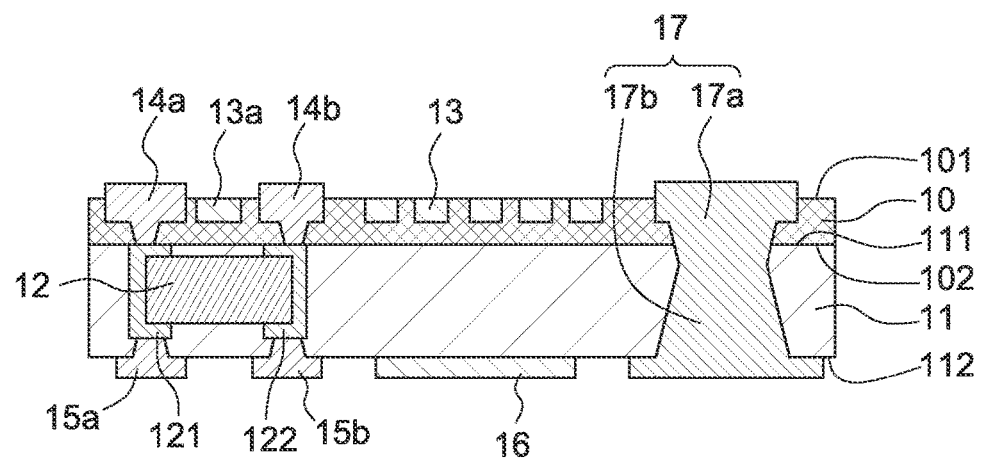

Referring to FIG. 2H, a plurality of conductive vias are formed in the via holes 14h, 15h and 17h. For example, conductive vias 14a, 14b are formed in via holes 14h, conductive vias 15a, 15b are formed in via holes 15h, and conductive vias 17a and 17b are formed in via holes 17ah and 17bh, respectively. Conductive vias 14a and 15a are electrically connected to electrical contact 121 of the passive element 12, and conductive vias 14b and 15b are electrically connected to electrical contact 122 of the passive element 12. The conductive vias 17a and 17b are connected in the through via hole 17h to form a through via 17.

In some embodiments, after filling the electrically conductive material, such as metal, into via holes 14h and 17ah to form the conductive vias 14a, 14b and 17a, the electrically conductive material may exceed the first surface 101 of the first dielectric layer 10. An etching process may be performed to remove at least a part of the electrically conductive material so that the top surfaces of the conductive vias 14a, 14b and 17a are substantially coplanar with each other. The electrically conductive material may be further removed so that the top surfaces of the conductive vias 14a, 14b and 17a are substantially coplanar with the surface 101 of the first dielectric 10 (see, e.g., an alternative embodiment illustrated in FIGS. 3, 4A, 4B). In other embodiments, the top surfaces of the conductive vias 14a, 14b and 17a are substantially coplanar with each other or with the surface 101 of the first dielectric 10 after the formation of the conductive vias 14a, 14b and 17a; therefore, the etching process can be eliminated.

Subsequent to the formation of the conductive vias 14a, 14b, 15a, 15b, 17a and 17b, the metal layer 9 is removed.

The metal layer 9 may be removed by etching or machining, for example. In other embodiments, the metal layer 9 may be removed prior to the formation of the conductive vias 14a, 14b, 15a, 15b, 17a and 17b.

A second patterned conductive layer 16 is formed on the second surface 112 of the second dielectric layer 11. The second patterned conductive layer 16 may be formed, for example, using photo-lithography and plating technology. The second patterned conductive layer 16 may be, in some embodiments, a relatively flat and smooth redistribution layer (RDL). The second patterned conductive layer 16 may include, but is not limited to, copper or another metal or alloy.

Figure 2I:
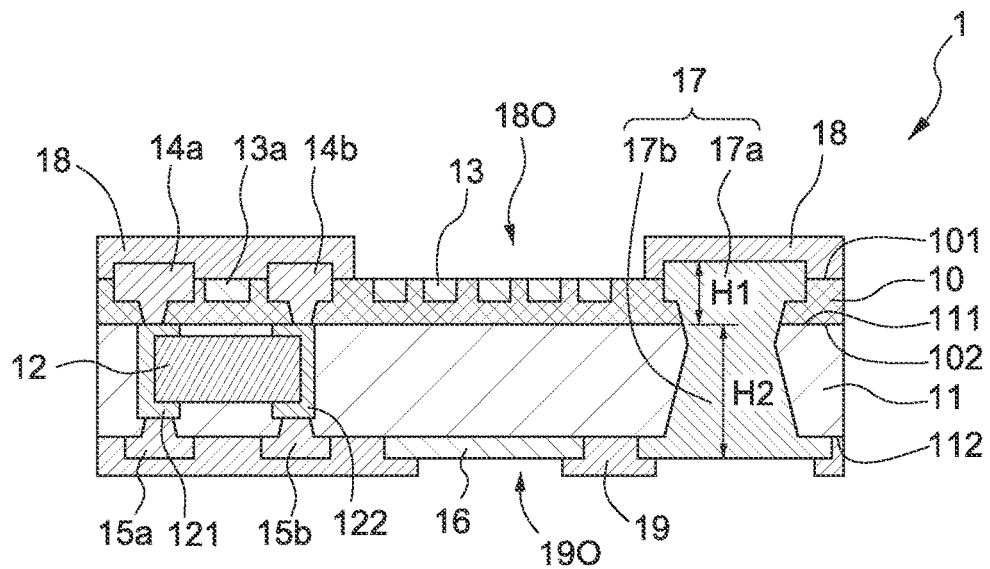

Referring to FIG. 2I, a first solder resist layer 18 may be formed on the first surface 101 of the first dielectric layer 10. The first solder resist layer 18 covers a portion of the first patterned conductive layer such as the trace 13, the conductive vias 14a and 14b and the first conductive via 17a. The first solder resist layer 18 comprises at least one opening 180 to expose portions of the first patterned layer 13.

A second solder resist layer 19 may be formed on the second surface 112 of the second dielectric layer 11. The second solder resist layer 19 covers a portion of the second patterned conductive layer 16, the conductive vias 15a, 15b and a portion of the second conductive via 17b. The second solder resist layer 19 comprises at least one opening 190 to expose portions of the second patterned conductive layer 16.

Figure 3:
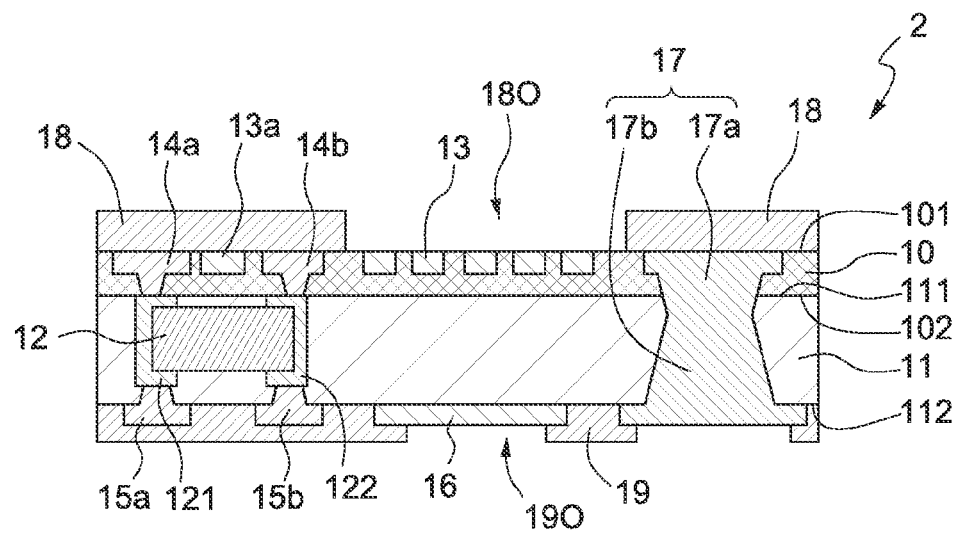
FIG. 3 illustrates a cross-sectional view of a semiconductor package structure in accordance with an embodiment of the present disclosure.

FIG. 3 illustrates a cross-sectional view of a semiconductor package structure 2 in accordance with an embodiment of the present disclosure. The semiconductor package structure 2 shown in FIG. 3 is similar to the semiconductor package structure 1 as illustrated and described with reference to FIG. 1, except that the top surface of the conductive vias 14a, 14b and 17a are substantially coplanar with the first surface 101 of the first dielectric layer 10. In other words, the first conductive vias 14a, 14b and 17a are embedded in the first dielectric layer 10.

Figure 4A:
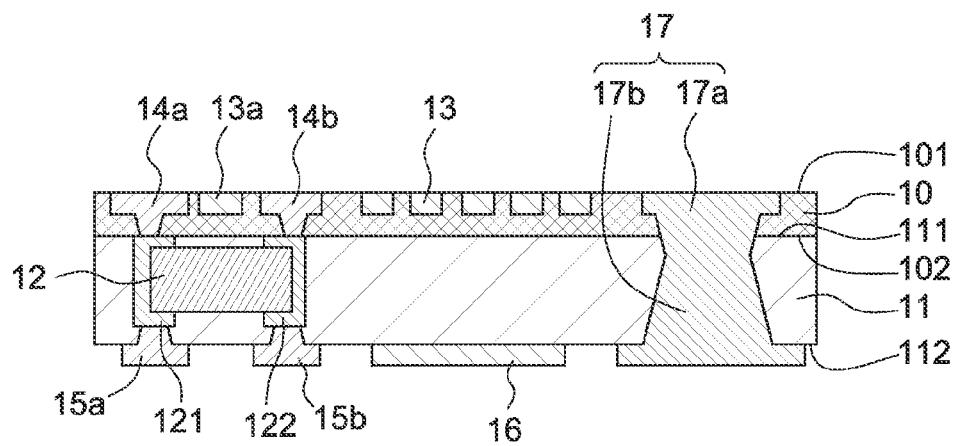
FIGS. 4A and 4B illustrate a manufacturing method in accordance with an embodiment of the present disclosure.
Figure 4B:
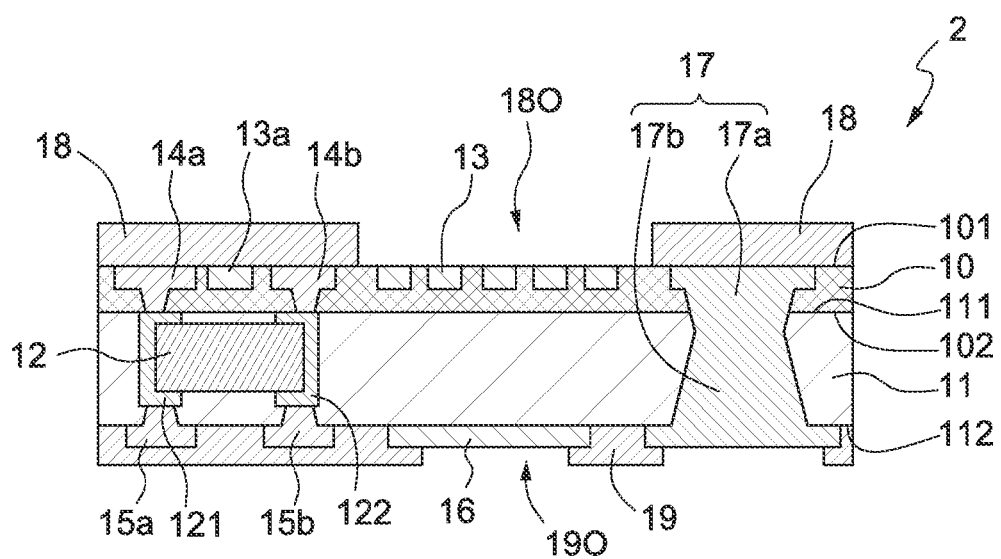

FIGS. 4A and 4B illustrate a manufacturing method in accordance with an embodiment of the present disclosure. The method for manufacturing semiconductor package structure 2 is similar to the method as illustrated and described with reference to FIGS. 2A, 2B, 2C, 2D, 2E, 2F, 2G, 2H and 2I, except that the metal layer 9 and the portions of the conductive vias 14a, 14b and 17a that extend beyond the first surface 101 of the first dielectric layer 10 are removed subsequent to the formation of conductive vias 14a, 14b, 15a, 15b and 17. Accordingly, the top surfaces of the conductive vias 14a, 14b and 17a are substantially coplanar with the first surface 101 of the first dielectric layer 10. The metal layer 9 and the portion of the conductive vias 14a, 14b and 17a may be, for example, mechanically removed, or may be removed by etching or other technology.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

In some embodiments, two surfaces can be deemed to be coplanar or substantially coplanar if a displacement between the surfaces is small, such as no greater than 1 μm, no greater than 5 μm, or no greater than 10 μm.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor package structure comprising:
   a first dielectric layer having a first surface and a second surface opposite the first surface;
   a second dielectric layer having a first surface and a second surface opposite the first surface, the second surface of the first dielectric layer being attached to the first surface of the second dielectric layer;
   a component within the second dielectric layer and in direct contact with the second dielectric layer, the component comprising at least two electrical contacts;
   a first patterned conductive layer exposed from the first surface of the first dielectric layer and embedded in the first dielectric layer without protruding from the first surface of the first dielectric layer; and
   at least two conductive vias penetrating the first dielectric layer or the second dielectric layer, each conductive via electrically connected to a respective one of the at least two electrical contacts.

2. The semiconductor package structure of claim 1, wherein the at least two electrical contacts comprises two electrical contacts disposed on opposite sides of the component, and at least a portion of a first surface of each of the electrical contacts is exposed by the second dielectric layer.

3. The semiconductor package structure of claim 2, wherein each conductive via is disposed on the exposed portion of the first surface of the respective one of the two electrical contacts.

4. The semiconductor package structure of claim 1, wherein the component is positioned within the second dielectric layer such that, for each of the at least two electrical contacts, a projection of a perimeter of a first surface of the electrical contact intersects the first surface of the second dielectric layer and a projection of a perimeter of a second surface of the electrical contact intersects the second surface of the second dielectric layer.

5. The semiconductor package structure of claim 4, wherein the at least two contacts comprise a first electrical contact and a second electrical contact, and the first patterned conductive layer comprises at least one trace passing over the component and between the projection of the perimeter of the first surface of the first electrical contact and the projection of the perimeter of the first surface of the second electrical contact.

6. The semiconductor package structure of claim 5, wherein the at least two conductive vias comprises a first conductive via extending from the second surface of the second dielectric layer to the first electrical contact and a second conductive via extending from the second surface of the second dielectric layer to the second electrical contact.

7. The semiconductor package structure of claim 6, wherein the at least two conductive vias further comprises a third conductive via extending from the first surface of the first dielectric layer to the first electrical contact and a fourth conductive via extending from the first surface of the first dielectric layer to the second electrical contact.

8. A semiconductor package structure comprising:
a first dielectric layer having a first surface and a second surface opposite the first surface;
a second dielectric layer having a first surface and a second surface opposite the first surface, the second surface of the first dielectric layer being attached to the first surface of the second dielectric layer;
a component within the second dielectric layer, the component comprising at least two electrical contacts;
a first patterned conductive layer within the first dielectric layer, a top surface of the first patterned conductive layer being substantially coplanar with the first surface of the first dielectric layer; and
at least two conductive vias penetrating the first dielectric layer or the second dielectric layer and electrically connected to a respective one of the at least two electrical contacts.

9. The semiconductor package structure of claim 8, wherein the at least two electrical contacts comprises two electrical contacts disposed on opposite sides of the component, and at least a portion of a first surface of each of the electrical contacts is exposed by the second dielectric layer.

10. The semiconductor package structure of claim 9, wherein each conductive via of the at least two conductive vias is disposed on the exposed portion of the first surface of the respective one of the at least two electrical contacts.

11. The semiconductor package structure of claim 9, wherein the component is positioned within the second dielectric layer such that, for each of the at least two electrical contacts, a projection of a perimeter of a first surface of the electrical contact intersects the first surface of the second dielectric layer and a projection of a perimeter of a second surface of the electrical contact intersects the second surface of the second dielectric layer.

12. The semiconductor package structure of claim 11, wherein the at least two contacts comprise a first electrical contact and a second electrical contact, and the first patterned conductive layer comprises at least one trace passing over the component and between the projection of the perimeter of the first surface of the first electrical contact and the projection of the perimeter of the first surface of the second electrical contact.

13. The semiconductor package structure of claim 12, wherein the at least two conductive vias comprises a first conductive via extending from the second surface of the second dielectric layer to the first electrical contact and a second conductive via extending from the second surface of the second dielectric layer to the second electrical contact.

14. The semiconductor package structure of claim 13, wherein the at least two conductive vias further comprises a third conductive via extending from the first surface of the first dielectric layer to the first electrical contact and a fourth conductive via extending from the first surface of the first dielectric layer to the second electrical contact.

15. A semiconductor package structure comprising:
a first dielectric layer having a first surface and a second surface opposite the first surface;
a second dielectric layer having a first surface and a second surface opposite the first surface, the second surface of the first dielectric layer facing the first surface of the second dielectric layer;
a component within the second dielectric layer, the component comprising a first electrical contact and a second electrical contact, the component positioned such that a projection of a perimeter of a first surface of each of the first and second electrical contacts intersects the first surface of the second dielectric layer; and
a first patterned conductive layer within the first dielectric layer and without protruding from the first dielectric layer, the first patterned conductive layer comprising at least one trace passing over the component and between the projection of the perimeter of the first surface of the first electrical contact of the component and the projection of the perimeter of the first surface of the second electrical contact of the component.

16. The semiconductor package structure of claim 15, wherein at least a portion of the first surface of the first electrical contact and at least a portion of the first surface of the second electrical contact are exposed by second dielectric layer.

17. The semiconductor package structure of claim 16, further comprising a first conductive via disposed on the exposed portion of the first electrical contact and a second conductive via disposed on the exposed portion of the second electrical contact.

18. A semiconductor package structure comprising:
a first dielectric layer having a first surface and a second surface opposite the first surface;
a second dielectric layer having a first surface and a second surface opposite the first surface, the second surface of the first dielectric layer facing the first surface of the second dielectric layer;
a component within the second dielectric layer, the component comprising a first electrical contact and a second electrical contact, the component positioned such that a projection of a perimeter of a first surface of each of the first and second electrical contacts intersects the first surface of the second dielectric layer;
a first patterned conductive layer within the first dielectric layer, the first patterned conductive layer comprising at least one trace passing over the component and between the projection of the perimeter of the first surface of the first electrical contact and the projection of the perimeter of the first surface of the second electrical contact; and
a first conductive via extending from the first surface of the first dielectric layer to the first electrical contact and a second conductive via extending from the first surface of the first dielectric layer to the second electrical contact.

19. The semiconductor package structure of claim 15, further comprising a first conductive via extending from the second surface of the second dielectric layer to the first electrical contact and a second conductive via extending from the second surface of the second dielectric layer to the second electrical contact.

20. A semiconductor package structure comprising:
- a first dielectric layer having a first surface and a second surface opposite the first surface;
- a second dielectric layer having a first surface and a second surface opposite the first surface, the second surface of the first dielectric layer facing the first surface of the second dielectric layer;
- a component within the second dielectric layer, the component comprising a first electrical contact and a second electrical contact, the component positioned such that a projection of a perimeter of a first surface of each of the first and second electrical contacts intersects the first surface of the second dielectric layer;
- a first patterned conductive layer within the first dielectric layer, the first patterned conductive layer comprising at least one trace passing over the component and between the projection of the perimeter of the first surface of the first electrical contact and the projection of the perimeter of the first surface of the second electrical contact; and
- a first conductive via extending from the first surface of the first dielectric layer to the first surface of the first electrical contact and a second conductive via extending from the second surface of the second dielectric layer to a second surface of the first electrical contact.

21. The semiconductor package structure according to claim 1, wherein at least a portion of the first patterned conductive layer is disposed over, and is electrically isolated from, the component.

* * * * *